United States Patent
Ikeda et al.

(10) Patent No.: US 7,122,956 B2
(45) Date of Patent: Oct. 17, 2006

(54) OLED DISPLAY AND METHOD OF MANUFACTURING SUCH DISPLAY

(75) Inventors: Nami Ikeda, Shiga (JP); Mitsuo Morooka, Shiga (JP); Shinya Ono, Shiga (JP); Keigo Kanoh, Shiga (JP); Koji Murayama, Shiga (JP); Koichi Miwa, Shiga (JP)

(73) Assignees: Chi Mei Optoelectronics Corp., Tainan County (TW); Kyocera Corporation, Kyoto (JP)

(*) Notice: Subject to any disclaimer, the term of this patent is extended or adjusted under 35 U.S.C. 154(b) by 0 days.

(21) Appl. No.: 10/926,379

(22) Filed: Aug. 25, 2004

(65) Prior Publication Data

US 2005/0046341 A1 Mar. 3, 2005

(30) Foreign Application Priority Data

Aug. 28, 2003 (JP) .............................. 2003-209273

(51) Int. Cl.
*H01J 1/62* (2006.01)
*H01J 1/70* (2006.01)
*H01J 1/72* (2006.01)

(52) U.S. Cl. ...................................... 313/504; 313/506
(58) Field of Classification Search ................ 313/503, 313/506, 504
See application file for complete search history.

(56) References Cited

U.S. PATENT DOCUMENTS 5,742,129 A * 4/1998 Nagayama et al. ......... 313/498
6,114,805 A * 9/2000 Codama et al. ............. 313/509
6,320,311 B1 * 11/2001 Nakaya et al. .............. 313/506
6,500,295 B1 * 12/2002 Kubota ....................... 313/506
6,621,213 B1 * 9/2003 Kawashima ................ 313/506
2002/0043932 A1 * 4/2002 Kawashima ................ 313/512
2003/0146692 A1 * 8/2003 Uchida ....................... 313/504

FOREIGN PATENT DOCUMENTS

JP 08-227276 9/1996
JP 2003-22035 1/2003

* cited by examiner

*Primary Examiner*—Nimeshkumar D. Patel
*Assistant Examiner*—Peter Macchiarolo
(74) *Attorney, Agent, or Firm*—Milde & Hoffberg, LLP

(57) ABSTRACT

An organic light emitting diode (OLED) display comprises: an insulating substrate; common electrodes; a first electrode layer formed in a region adjacent to the common electrodes formed on the insulating substrate electrically isolated from the common electrodes; an insulating layer which coats the insulating substrate and respectively opens a first opening window exposing a part of the common electrodes and a second opening window exposing at least a part of the first electrode layer; ribs or walls which form a cell area by crossing the common electrodes on the insulating substrate and surround each of the opening windows; a material layer formed on the first electrode layer exposed by the second opening window; and a second electrode layer which coats the cell area surrounded by the ribs and is electrically connected to the common electrodes through the first opening window.

16 Claims, 9 Drawing Sheets

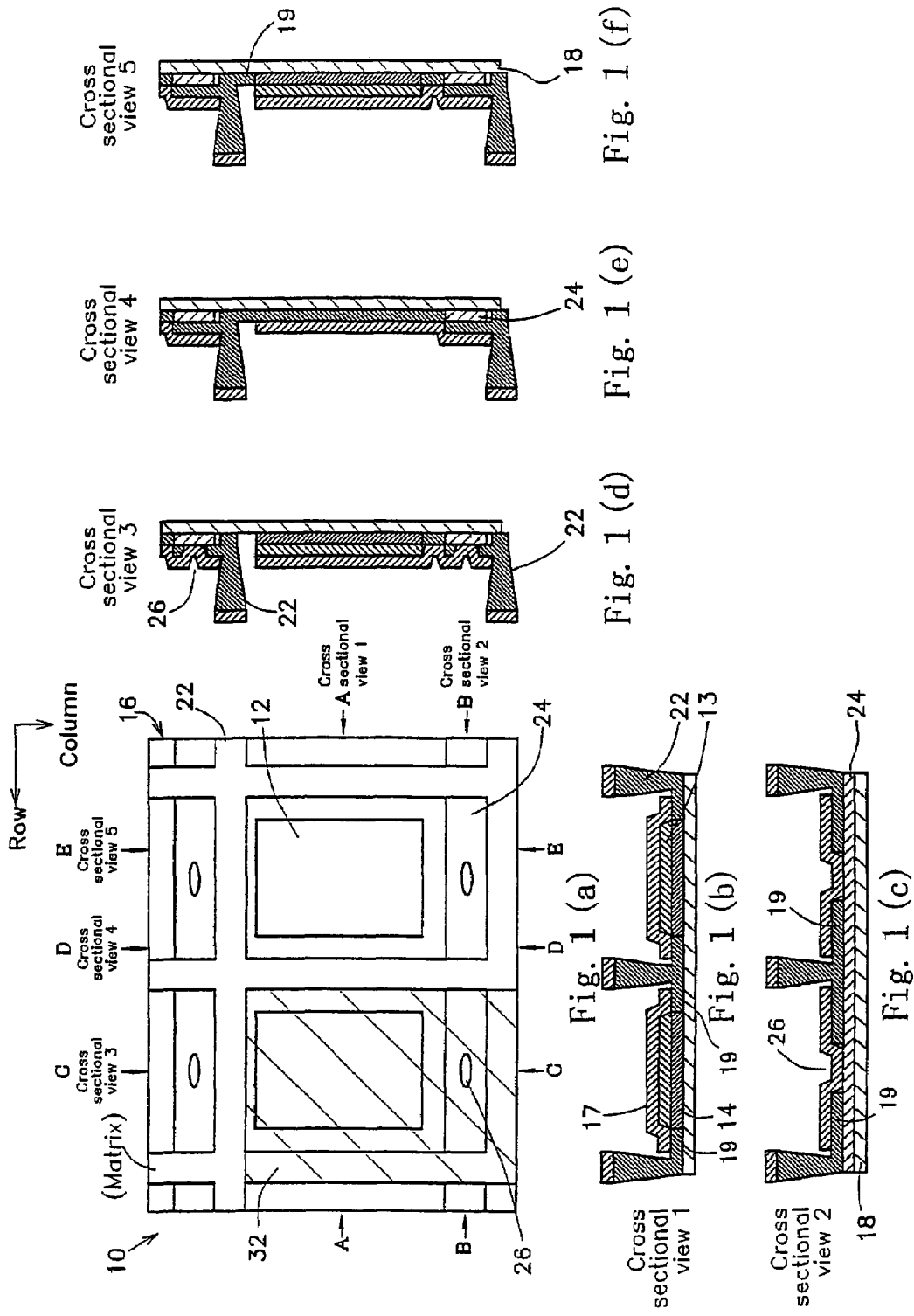

OLED DISPLAY AND METHOD OF MANUFACTURING SUCH DISPLAY

BACKGROUND OF THE INVENTION

1. Field of the Invention

The present invention relates to a method for removing luminance nonuniformity and crosstalk occurences on a display using organic electroluminescence and an organic electroluminescence display manufactured by this method.

2. Description of Related Art

Organic electroluminescent elements are configured by sandwiching a material layer between an anode and a cathode. The material layer may comprise a plurality of layers, such as an electron-injecting layer or a hole-injecting layer and an electron-transporting layer or a hole-transporting layer. Its emitting principle is similar to that of the emitting mechanism of light emitting diodes (LED). More specifically, a hole and an electron are fed into a light-emitting layer by the application of a direct current voltage between the anode and the cathode. The electronic state of organic molecules included in the light-emitting layer is changed to the excited state by energy generated by a recombination of the hole and electron in the light-emitting layer. Energy is emitted as light when this quite unstable electronic state falls to a ground state. Accordingly, organic electroluminescence is referred to also as organic light emitting device (OLED).

In an OLED display, OLED elements are arranged on a substrate, such as a glass substrate, as a matrix to emit light to show information. OLED displays are expected to gain a substantial market share because of their superiority in electric power consumption, reaction speed, visual field, and luminance compared with other types of displays, such as liquid crystal displays.

A method for driving OLED elements is roughly divided into two kinds of systems: a passive matrix system and an active matrix system. As shown in FIGS. 5(a) and 5(b), the passive matrix system is a driving method to intersect an anode 114 and a cathode 116 in a matrix state to selectively activate OLED elements sandwiched at an intersection. On the other hand, as shown in FIGS. 6(a) and 6(b), the active matrix system is a driving method to activate OLED elements by having switching and memory functions for each pixel 130 using a thin film transistor (TFT) 120.

Using the passive matrix system enables low production costs of displays because of its simple structure. However, large electric power consumption is required to keep the screen at high luminance because this system indicates information by sequentially emitting lines and using an after-image retained by the eyes. For this reason, the active matrix system for activating the pixels 130 with energy from the TET's 120 has been adopted more frequently despite its high production costs. Compared with the passive matrix system, the active matrix system produces a high luminance at a low electric power consumption.

An OLED display 110 has two systems for emitting luminance: bottom-emitting system and top-emitting system. As shown in FIG. 7(a), the bottom-emitting system takes out light from an insulating substrate side 118. As shown in FIG. 7(b), the top-emitting system takes out light from a top surface layer 115.

Japanese Patent Publication No. 8-227276 discloses embodiments of a method of manufacturing bottom-emitting and top-emitting OLED displays. According to these embodiments, an OLED display shown in FIG. 10(a) is manufactured by the processes shown in FIGS. 10(b) to 10(d). More particularly, as shown in FIG. 10(b), a plurality of parallel first display electrode lines 214 made of indium tin oxide (ITO) or the like are deposited as stripes on a glass substrate 218. Ribs or walls 222 of polyimides or the like are formed on the first display electrode lines 214, so that island-shaped first display electrode portions 215 are defined and surrounded as shown in FIG. 10(c). An OLED light-emitting layer 213 is formed on each recess of the glass substrate 218 wherein the ribs (walls) 222 are formed. Next, a plurality of parallel stripe second display electrode lines 217 of low resistance metal are vacuum-deposited or sputtered with a shadow mask with parallel slits on the ribs 222 and the light-emitting layers 213 so that the second display electrode lines 217 extend perpendicular to the first display electrode lines 214.

In the area surrounded by the ribs 222, a TFT connected to the first display electrode portions 215 is formed on the glass substrate 218, where data signal lines and scan signal lines or the like are arranged. As shown in FIG. 10(a), in this embodiment, the OLED display emits light from the glass substrate side 218.

In the active matrix system, the aperture ratio is reduced due to TFT, capacitors, and wiring or the like when passing light through the glass substrate side 218 in the bottom-emitting system. Consequently, when the active matrix system is adopted, the top-emitting system is advantageous. Light is not shielded by the TFT, which results in an increase of the aperture ratio and high luminance when adopting the top-emitting system.

FIG. 11 shows a cross sectional view of the structure of a top-emitting active matrix OLED display. In FIG. 11, an OLED display 310 comprises: an insulating substrate 318; a thin film transistor (TFT) 320 formed on the insulating substrate 318; an insulating layer 319; a first electrode 314; a material layer 313; a second electrode 317; and a virtual hole 326 for connecting the first electrode 314 and the TFT 320 through the insulating layer 319.

Unlike the bottom-emitting system, the second electrode 317 is required to be made from a transparent material because the OLED display 310 emits luminance through the second electrode side 317. Further, to increase optical transmittance, the second electrode 317 needs to be as thin as possible. Moreover, the second electrode 317 may be laminated covering the entire surface of the OLED display.

A light-emitting layer included in the material layer 313 of the OLED display 310 emits light which passes through the second electrode side 317.

Since the structure of such top-emitting active matrix OLED displays is various, the second electrode 317 covering the entire surface of the above-mentioned OLED display may be divided into stripes as in the case of the passive matrix system. Further, the virtual hole 326 in the layer 319 connects the first electrode 314 to the TFT 320, and may be used to connect, for example, the second electrode and the common electrodes.

One example of a top-emitting active matrix OLED display having ribs will be now described with reference to FIGS. 8(a) and 8(b).

AS shown in FIG. 8(b), in an OLED display 110, ribs 122 are arranged on an insulating substrate 118 in parallel. As shown in FIG. 8(a), OLED elements 112 are sandwiched between ribs 122. The area of one unit of matrix divided by the ribs 122 and OLED elements 112 are referred to as a cell area 132. The cells, completed by equipping the cell area 132 with the TFT 120 and the OLED elements 112, are referred to as pixels 130.

The pixels 130 in each cell area 132 are so configured that an anode 114 and the ribs 122 are formed on the insulating substrate 118 by sandwiching the anode 114 in the column direction of the matrix in parallel as shown in FIG. 8(a). Further, in parallel with the ribs 122, common electrodes 124 isolated from the anode 114 and the ribs 122 are formed on the insulating substrate 118. Furthermore, the OLED elements 112 are formed by the lamination of at least a light-emitting layer and a thin film cathode 117 on the upper part of the anode 114. Moreover, the thin film cathode 117 is laminated on the pixels 130. And the virtual holes 126 for conducting the thin film cathode 117 and the common electrodes 124 may be formed in each cell area 132.

The thin film cathode 117 is laminated on the entire surface of the OLED display 110. The thin film cathode 117 is partitioned by the ribs 122 formed among the adjacent cell areas 132 in a column direction when laminating the thin film cathode. The anode 114 is not needed to be optically transparent in top emitting system but may be made from a metal, such as Al.

Additionally, the cell areas 132 are rectangular in shape. Each cell area 132 includes OLED elements 112. The common electrodes 124 are formed on the insulating substrate 118 in parallel with the ribs 122 to be isolated from the anode 114. The common electrodes 124 may conduct with the thin film cathode 117 through the virtual holes 126 formed within each cell area. Accordingly, the thin film cathode 117 laminated on the surface of the OLED display 110 is equipotential through the common electrodes 124.

When an OLED display 110 having such configuration is driven employing the active matrix and top-emitting systems, a circuit formed by circuit elements, such as the OLED elements 112 and common electrodes 124 as are shown in the schematic diagram 4(a) or 4(b) as an ideal example. More specifically, the OLED elements 112 emit light by the application of a forward voltage between the OLED elements 112 through the TFT because of this mechanism. For example, in FIG. 4(a), a current passing through the OLED elements passes into the common electrodes 124 from the surface of the thin film cathode 117. The following explanation is given using the schematic diagram 4(a) for convenience sake.

Considering a circuit as shown in FIG. 4(a), a predetermined amount of current always passes through the OLED elements 112 which are selected by applying a certain voltage. A current does not always pass through the OLED elements 112 which are not selected. On the other hand, it is known that the luminance of the OLED elements 112 is approximately proportional to the current passing through these OLED elements 112. It follows that the light emission of the selected OLED elements 112 is performed at predetermined luminance while the light emission of the unselected OLED elements 112 is never performed, which results in no unexpected luminance nonuniformity.

Upon driving the OLED display 110 having the above-mentioned configuration, however, as shown in FIG. 9, it has turned out that an apparent linear luminance nonuniformity appears on the surface of the display. Especially, such linear luminance nonuniformity distinctly appears on top-emitting active matrix OLED displays wherein ribs 122 are arranged in parallel, as in the above-mentioned systems. Further, luminance nonuniformity in a spot shape easily occurs on the kind of OLED displays without ribs 122, wherein the entire surface is covered with a thin film electrode.

SUMMARY OF THE INVENTION

An OLED display according to the present invention comprises: an insulating substrate; common electrodes formed on the insulating substrate; a first electrode layer formed in a region adjacent to the common electrodes formed on the insulating substrate electrically isolated from the common electrodes; an insulating layer which coats the insulating substrate by respectively opening a first opening window exposing a part of the common electrodes and a second opening window exposing at least a part of the first electrode layer; ribs which form a cell area by crossing the common electrodes on the insulating substrate and surround each of the opening windows; a material layer formed on the first electrode layer exposed by the second opening window; and a second electrode layer which coats the cell area surrounded by the rib and is electrically connected to the common electrodes through the first opening window. The crossing walls of these ribs include a reserve tapered shape.

A method for manufacturing an OLED display according to the present invention comprises: preparing an insulating substrate; forming common electrodes on the insulating substrate; forming a first electrode layer in a region adjacent to the common electrodes formed on the insulating substrate electrically isolated from the common electrodes; coating the insulating substrate with an insulating layer by respectively opening a first opening window exposing a part of the common electrodes and a second opening window exposing at least a part of the first electrode layer; forming a cell area on the insulating substrate by surrounding each of the opening windows with ribs across the common electrodes; forming a material layer on the first electrode layer exposed from the second opening window; and forming a second electrode layer electrically connected to the common electrodes through the first opening window by applying a coating within the cell area.

A second method for manufacturing an OLED display according to the present invention comprises: preparing an insulating substrate; forming band-like common electrodes on the insulating substrate; forming a first electrode layer in an region adjacent to the common electrodes formed on the insulating substrate; coating the insulating substrate with an insulating layer; forming ribs with the walls thereof in a reverse tapered shape and a thin insulating layer in a cell area surrounded with the ribs by etching the insulating layer across the common electrodes; forming a first opening window exposing a part of the common electrodes and a second opening window exposing a part of the first electrode layer on the insulating layer within the cell area; forming a material layer on the first electrode layer exposed by the second opening window; and electrically connecting the second electrode layer which coats the material layer to the common electrodes through the first opening window by coating the ribs with the second electrode layer as a mask within the cell area.

BRIEF DESCRIPTION OF THE DRAWINGS

FIG. 11 is a cross sectional view of a top-emitting active matrix OLED display.

DESCRIPTION OF THE PREFERRED EMBODIMENTS

Figure 2:
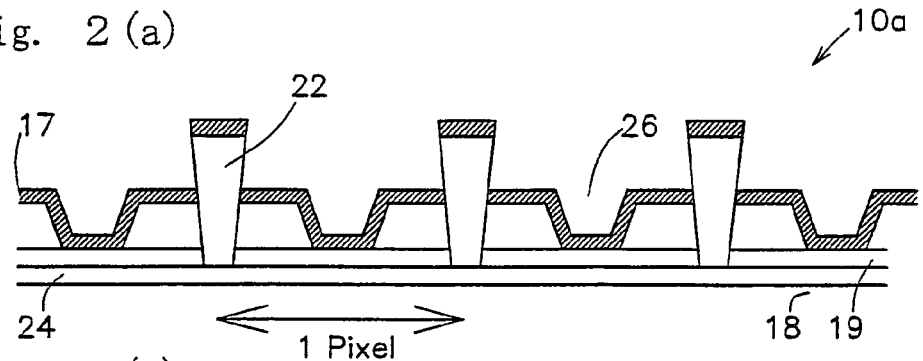
FIG. 2(a) is a cross sectional view of another embodiment of the OLED display of the present invention.
FIG. 2(b) is a cross sectional view of still another embodiment of the OLED display of the present invention.
Figure 2:
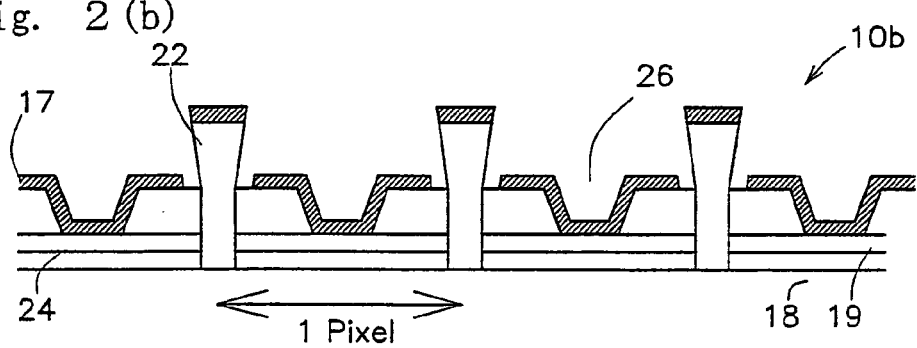

The present invention will now be described in detail. For the sake of convenience, a first electrode refers to an anode and a second electrode refers to a cathode. Further, a first opening window opened in an insulating layer for coating an insulating substrate refers to a virtual hole reaching from the surface of the cathode of OLED to common electrodes. An anode is exposed to the inside of a second opening window.

FIGS. 1(a) to 1(f) are a plan view and cross sectional views per each cut section of an OLED display in an embodiment of the present invention. In this embodiment, as shown in a shaded area of FIG. 1(a), an OLED display 10 is divided into cell areas 32 in matrix state by ribs 22 arranged on an insulating substrate 18 or an insulating layer 19 covering the insulating substrate 18. Inside the cell area 32, an anode 14 is formed on the insulating substrate 18, where common electrodes 24 are formed by being isolated from the anode 14 in parallel with the ribs 22. In addition, OLED elements 12 are formed on the anode 14 by laminating a material layer 13 and a thin film cathode 17, and virtual holes 26 conducting the thin film cathodes 17 and the common electrodes 24 are formed within the cell areas 32.

Figure 1:
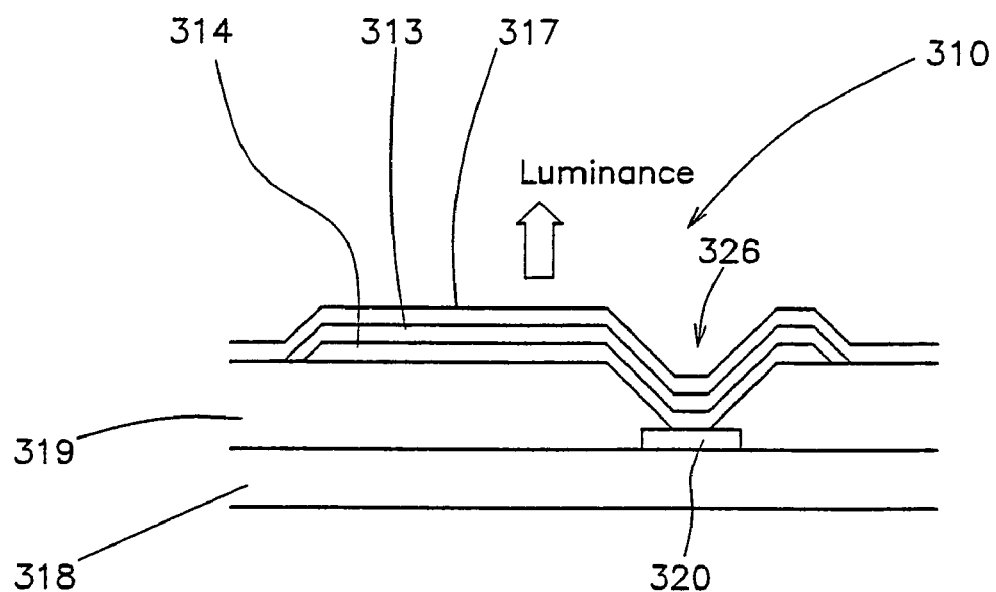
FIG. 1(a) is a plan view of a preferred embodiment OLED display according to the present invention.
FIG. 1(b) is a cross sectional view taken on line A—A of FIG. 1(a)
FIG. 1(c) is a cross sectional view taken on line B—B of FIG. 1(a)
FIG. 1(d) is a cross sectional view taken on line of C—C of FIG. 1(a)
FIG. 1(e) is a cross sectional view taken on line D—D of FIG. 1(a)
FIG. 1(f) is a cross sectional view taken on line E—E of FIG. 1(a).

The insulating substrate 18 herein may be, for example, a glass substrate. The ribs 22 are ribs made from an insulator, such as polymer and ribs in a reverse tapered shape. The anode 14 may be an electrode made from a metal, such as Al or an electrode made from other materials. Although the common electrodes 24 are preferably made from a metal having superior conductivity and their shape is not limited, as shown in FIG. 1(a), they may be common electrodes 24. Further, the thin film cathode 17 is prepared by utilizing a transparent electrode material itself or by laminating ordinary metals to be formed with the surface of the cell areas 32 covered. Furthermore, the material layer 13 sandwiched between the anode 14 and thin film cathode 17 may include a plurality of layers, such as an electron or a hole-injecting layer, an electron or a hole-transporting layer other than a light-emitting layer.

To solve the above-mentioned problems, the equivalent circuit of FIG. 4(a) is amended to assume the circuit of FIG. 4(c) as equivalent circuit of a realistic OLED display. The presence of a leakage current passing through the surface of the thin film cathode 17 uniformly laminated on the OLED display needs to be considered in FIG. 4(c).

Referring to the circuit represented in FIG. 4(c), OLED 1 to OLED 4 are assumed to be OLED elements 12. The OLED elements 12 are respectively connected to TFT 20 within the cell areas 32 and similarly connected to the common electrodes 24 through virtual holes 26 in the cell areas 32. Rg shows resistance of the common electrodes 24. Rc shows resistance among the cell areas 32. Rvia1 shows average resistance of the virtual holes 26. Rvia2 shows resistance of the virtual holes 26 having resistance different from Rvia1.

As described in the above-mentioned conventional examples, the thin film cathode of the surface of the OLED display is unidirectionally isolated by the ribs 22 arranged in stripes. However, no isolation is provided among OLED elements formed along the ribs 22, so that a leakage current may unidimensionally pass among the cell areas through the surface of the thin film cathode. Accordingly, in an equivalent circuit shown in FIG. 4(c), the presence of resistance Rc among the cell areas 32 needs to be considered.

Further, the virtual holes 26 are holes that reach from the surface of the thin film cathode 22 to the common electrodes 24 and seem to have large resistance Rvia1 as compared with the thin film cathode 22 in a planar state. Furthermore, the virtual holes 26 often have a nonuniform resistance because it is difficult to keep a uniform resistance. Consequently, a resistance Rvia2 of the virtual holes 26, different from that of the average virtual holes 26 has to be taken into consideration in the equivalent circuit diagram of FIG. 3. The equation of Rvia1>Rvia2>>Rc>>Rg is assumed to be established in the equivalent circuit diagram of FIG. 4(c).

In the equivalent circuit diagram of FIG. 4(c), such as the above-mentioned figure, current is passed into Rvia2 by passing a leakage current through Rc because Rvia2 is smaller than Rvia1. The effects of the presence of voltage depending on a path reaching Rvia2 enable the current value passing through each of the cell areas 32 to be different from the estimated current value. As mentioned above, emitting luminance of the OLED elements 12 depends on the current value. As a result, luminance nonuniformity is observed around Rvia2 in the cell areas 32 due to different luminance from other places of the display. Further, the leakage current has an impact on the current passing through the OLED elements in the cell areas 32 near Rvia2, so that luminance nonuniformity easily appears as linear luminance nonuniformity in the direction of the ribs because the thin film cathode 17 which is used as a flowing path is unidirectionally isolated.

To avoid such luminance nonuniformity, a method is adopted for closing off a path where a leakage current passes through by separating an anode and a cathode for each adjacent cell area. More particularly, a wide range of luminance nonuniformity is replaced with luminance nonuniformity in the cell areas 32 by arranging ribs among the cell areas 32 to interrupt the leakage current passing through the cell areas 32 in FIG. 3.

In this embodiment, an OLED display 10 is formed as mentioned below. As shown in FIGS. 1(a) to 1(f), common electrodes 24 are formed on an insulating substrate 18 and then ribs 22 are formed on the insulating substrate 18 and the common electrodes 24 for dividing the insulating substrate into a plurality of cell areas 32 to electrically isolate among each cell area. Next, the anode 14 is formed within the plurality of cell areas 32 and OLED elements 12 are formed by laminating in the order of a material layer 13 and a thin film cathode 17. Additionally, virtual holes 26 are formed for electrically connecting the thin film cathode 17 and the common electrodes 24.

The ribs 22 are made from an insulator and separate the anode 14 and thin film cathode 17 for each cell area 32. The thin film cathode 17 and common electrodes 24 in each cell area 32 are ordinarily of equal potential because they are connected to each other through the virtual holes 26. Even when a potential difference occurs among the cell areas 32 for a particular reason, there is no possibility of current passing among the cell areas 32 via the surface of the thin film cathode 17 due to the isolation of each of the cell areas 32 from the other cell areas by the formation of the ribs 22.

The ribs 22 are formed by applying a negative type photo resist onto the insulating substrate 18 employing the spin coat method which is developed after exposure using a photo mask. These ribs are in a reverse tapered shape in 10 μm order previously arranged on the insulating substrate 18. These ribs in a reverse tapered shape are formed, for example, with a negative-type photo polymer by utilizing the difference of developing speed caused by the difference in amount exposed in the thickness direction.

Such configuration of an OLED display 10 makes it possible to avoid the occurrence of the above-mentioned leakage current by electrically isolating each of the cell areas 32 from the thin film cathode 17 on the surface of the thin film cathode 17. That is, the ribs 22 isolate among the OLED elements 12, which prevents the current from passing among the cell areas 32 via the surface of the thin film cathode 17.

Figure 3:
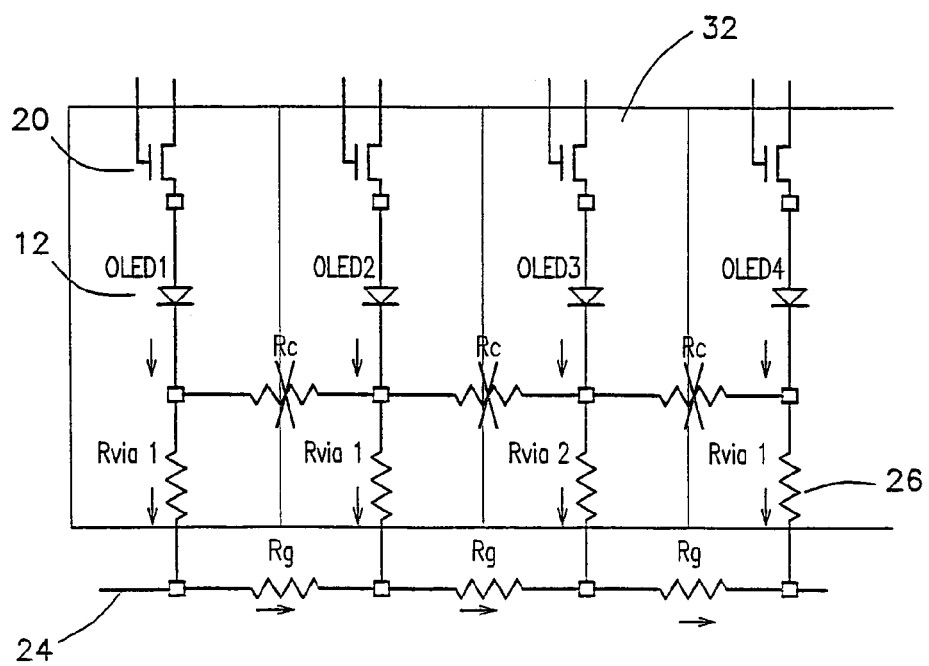
FIG. 3 is an equivalent circuit diagram of an OLED display of the present invention.

Further, the impact the ribs 22 make on luminance nonuniformity will be now described with reference to FIG. 3. Since an anode and a cathode are separated for each cell area 32 by the ribs 22 to close off the path for the leakage current, the current passing through the OLED elements 12, such as OLED 1, OLED 2, and OLED 4, reaches the common electrodes 25 through the resistance Rvia1. Accordingly, the current passing through three OLED elements 12 is uniform and the luminance is also uniform.

However, the current passing through the OLED elements 12 indicated as OLED 3 reaches the common electrodes 24 via the resistance Rvia2. From the above-mentioned conditions, Rvia1 is larger than Rvia2, so that the current passing through the OLED elements 12 indicated as OLED 3 becomes larger than the current passing through other OLED elements 12, indicated as OLED 1, OLED 2, and OLED 4. As a result, the luminance of OLED 3 is unexpectedly larger than the other 3 OLEDs, which leads to luminance nonuniformity.

Unlike conventional OLED displays, the OLED display of the present invention is capable of removing the whole linear luminance nonuniformity. More particularly, in FIG. 3, a wide range of luminance nonuniformity is replaceable with luminance nonuniformity in each of the cell areas 32.

The structure of the OLED display according to the present invention is not limited to the above-mentioned embodiments. For example, after common electrodes are formed on the entire surface of the insulating substrate 18, it is possible to laminate an insulating layer 19 on the entire surface of the common electrodes 24, and thereafter, the cell areas 32 may be formed by the ribs 22 on the insulating layer 19.

An anode 14 is formed within each cell area 32, and a material layer 13 and a thin film cathode 17 are laminated on the anode 14 in order to form the OLED elements 12. The ribs 22 are high enough to divide the thin film cathode 17 into each cell area 32. The virtual holes 26 for electrically connecting the thin film cathode 17 and the common electrodes 24 are formed by penetrating the anode 14 and insulating layer 19 in this embodiment.

The OLED display of this embodiment is also capable of interrupting the leakage current passing via the surface of the thin film cathode 17 in the cell areas 32 by the arrangement of the ribs among the cell areas 32. Accordingly, the OLED display of this embodiment, like the above-mentioned embodiments, is capable of removing a wide range of luminance nonuniformity.

Alternatively, as shown in FIG. 2(a), common electrodes 24 may be formed on the entire surface of an insulating substrate 18, and ribs 22 may be arranged on the common electrodes 24 so that cell areas 32 may be formed, and then an insulating layer 19 may be laminated. After that, OLED elements 12 and virtual holes 26 are formed within each cell area in the same manner as with the above-mentioned embodiments. The common electrodes 24 and an anode not are isolated by the insulating layer 19, and the thin film cathodes 17 located adjacent to each other are isolated by the ribs 22 in this embodiment as well as in the above-mentioned embodiments.

On the other hand, the ribs 22 may be directly arranged on the insulating substrate 18 in another embodiment shown in FIG. 4(b). Common electrodes 24, an insulating layer 19, an anode (not shown in figures), OLED elements (not shown in figures), and a thin film cathode 17 are laminated, in that order. In this case, a wide range of luminance nonuniformity is removable in the same manner as with the OLED display of the above-mentioned embodiments.

Although a thin film cathode is used in the embodiments of the OLED display according to the present invention, described above, a cathode with greater thickness may be laminated on a material layer 13. In this case, problems with luminance nonuniformity caused by a leakage current do not become evident as often because resistance of the thick cathode is smaller than that of the thin film cathode 17 and is sufficiently close to the resistance of the common electrodes 24. In addition, it is not so common that such problems of a wide range of luminance nonuniformity become evident when employing the bottom-emitting system for a similar reason.

Even when resistance of the thick cathode is small, luminance nonuniformity is presumed to appear not in a wide range but locally due to the mechanism described above. Consequently, a method for removing luminance nonuniformity using the ribs 22 of the present invention is effective regardless of whether the top-emitting system or the bottom-emitting system is used. The method for removing luminance nonuniformity using the ribs 22 of the present invention is effective for all OLED displays in which OLED elements 12 are not electrically insulated from each other on the surface electrode.

Figure 4:
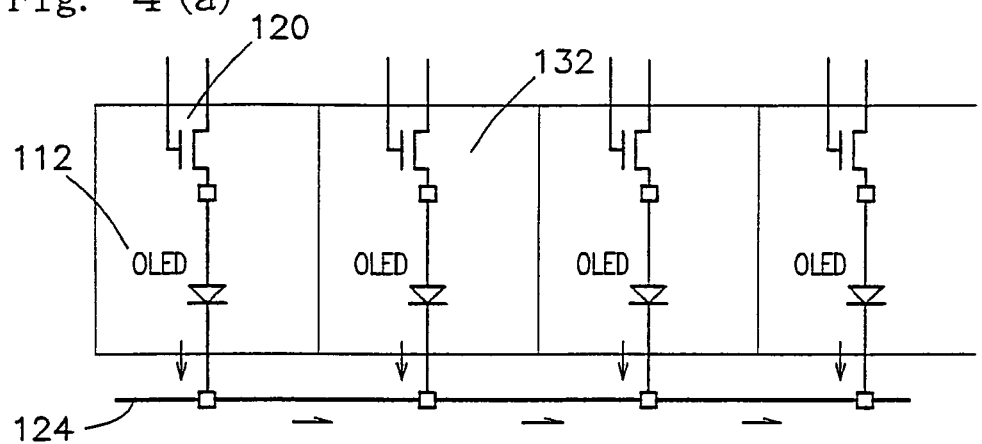
FIG. 4(a) is an ideal equivalent circuit diagram of a conventional top-emitting OLED display.
FIG. 4(b) is another ideal equivalent circuit diagram of a conventional top-emitting OLED display.
Figure 4:
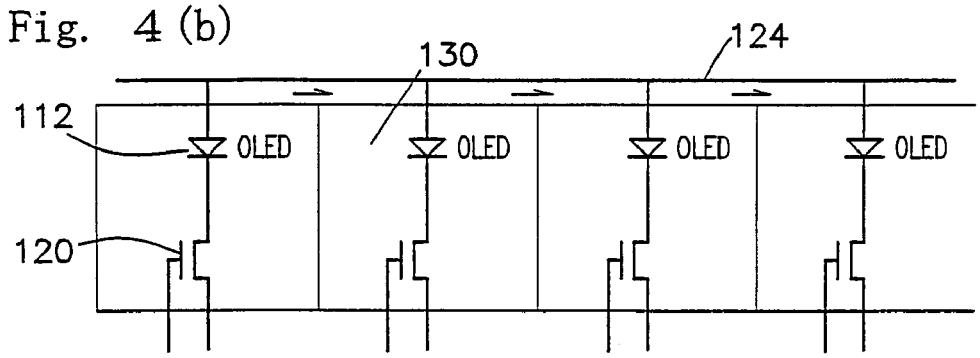
Figure 4:
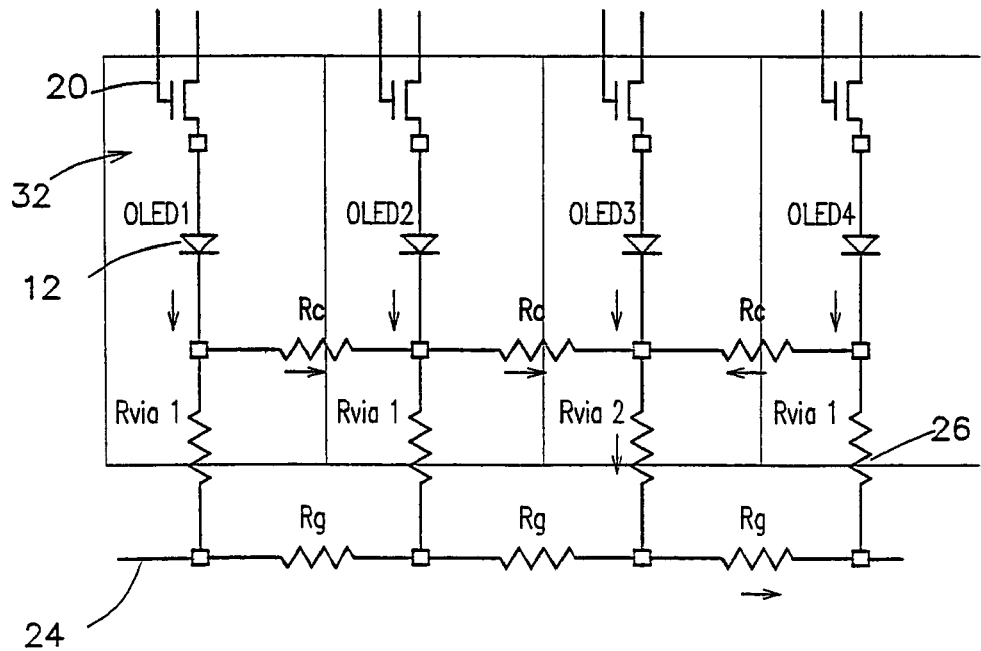
Figure 5:
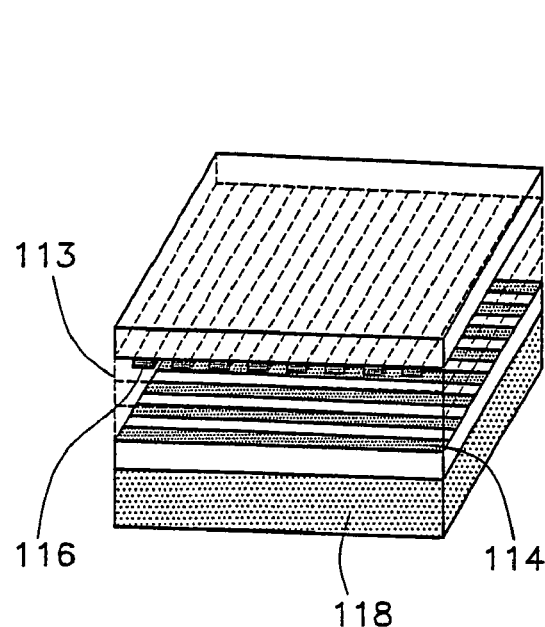
FIG. 5(a) is a perspective view of a passive matrix OLED display.
FIG. 5(b) is a plan view of a passive matrix OLED display.
Figure 5:
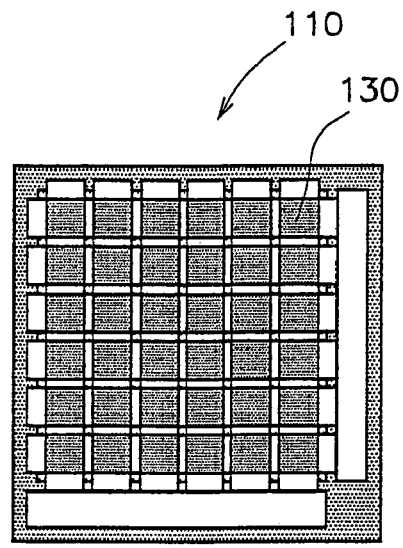
Figure 6:
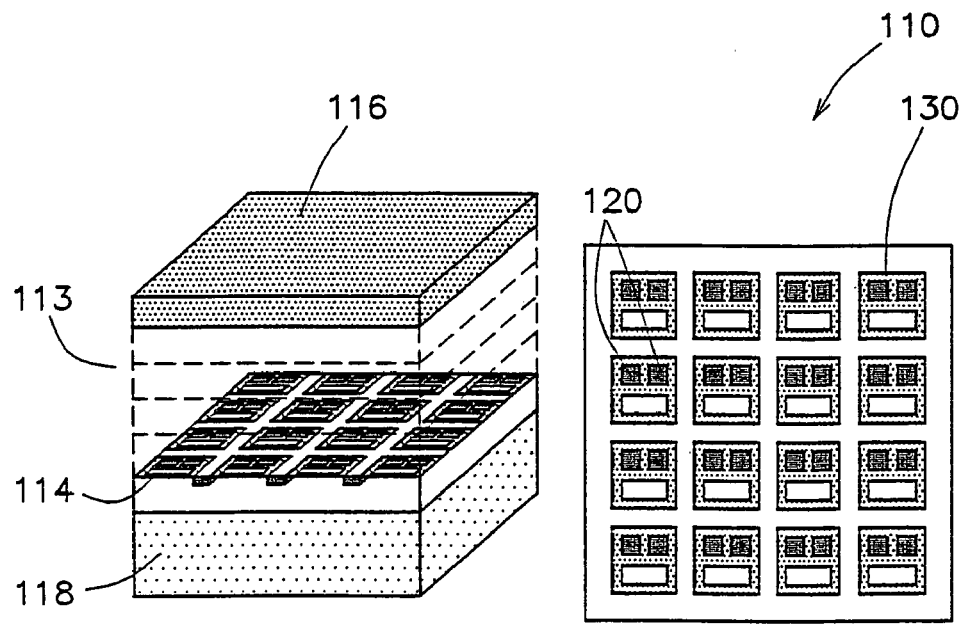
FIG. 6(a) is a perspective view of an active matrix OLED display.
FIG. 6(b) is a plan view of an active matrix OLED display.
Figure 7:
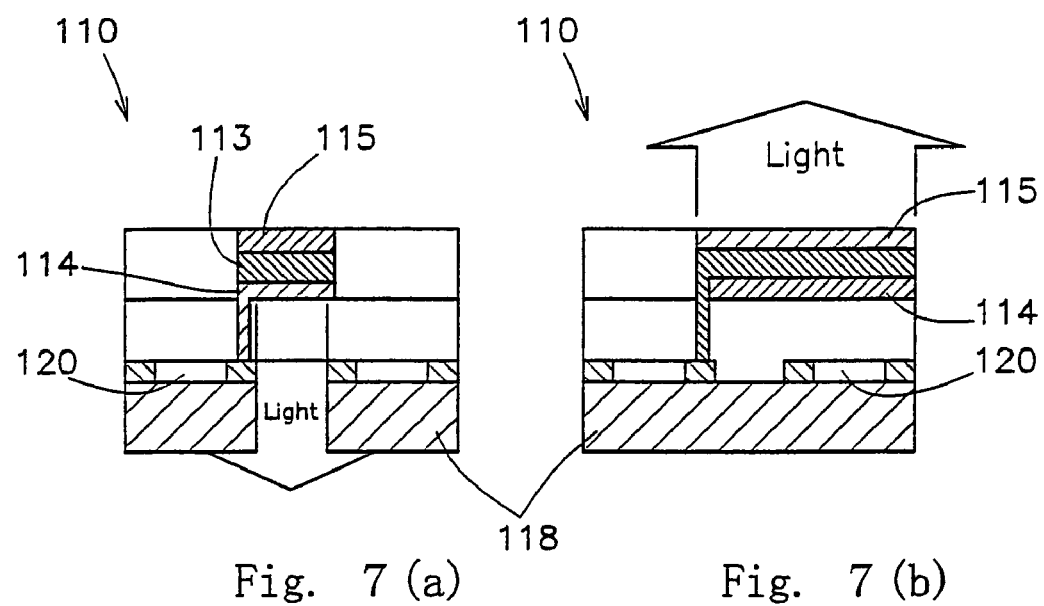
FIG. 7(a) is a cross sectional view of a bottom-emitting OLED display.
FIG. 7(b) is a cross sectional view of a top-emitting OLED display.
Figure 8:
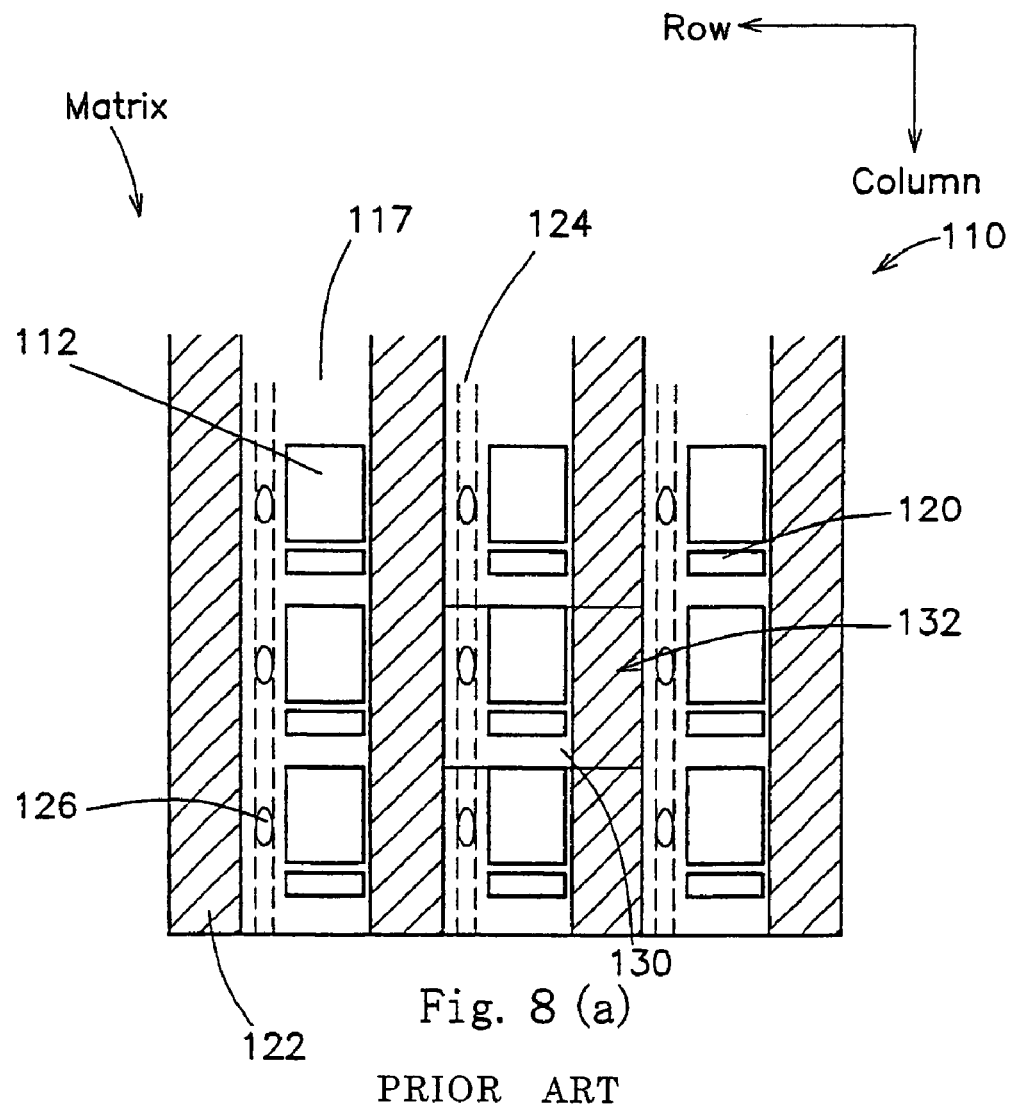
FIG. 8(a) is a plan view of a conventional OLED display.
FIG. 8(b) is a cross sectional view of FIG. 8(a).
Figure 8:
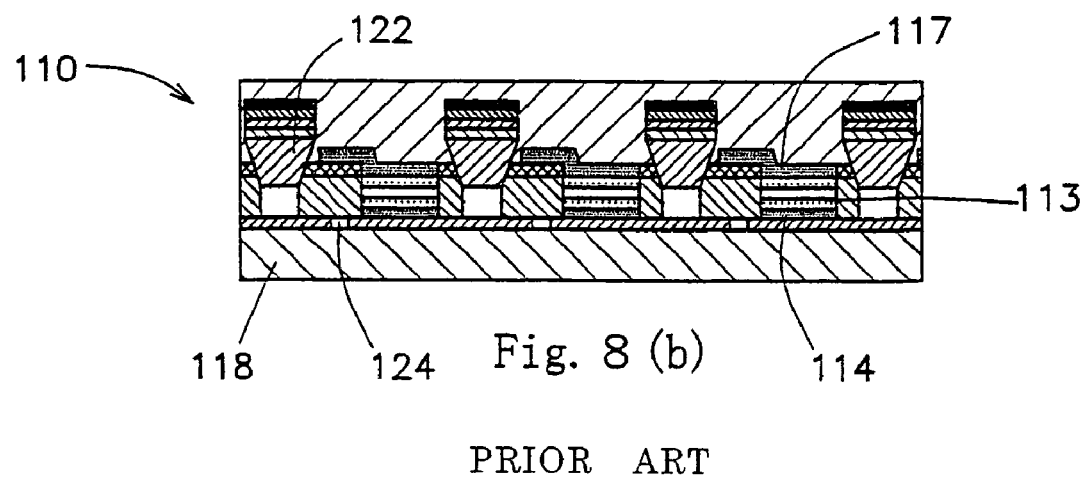
Figure 9:
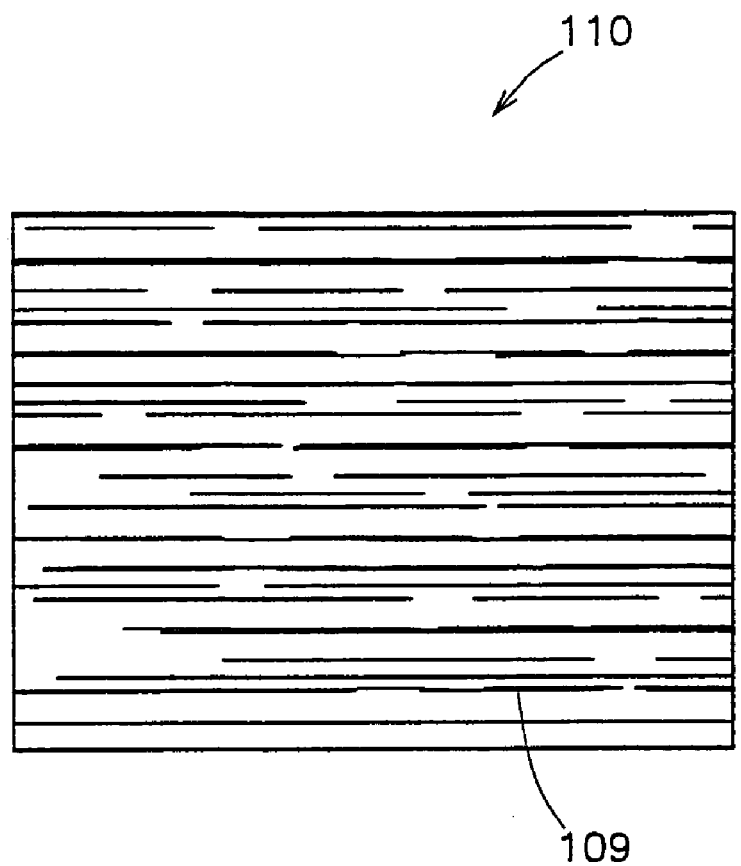
FIG. 9 shows a top-emitting OLED display having linear luminance nonuniformity.
Figure 10A:
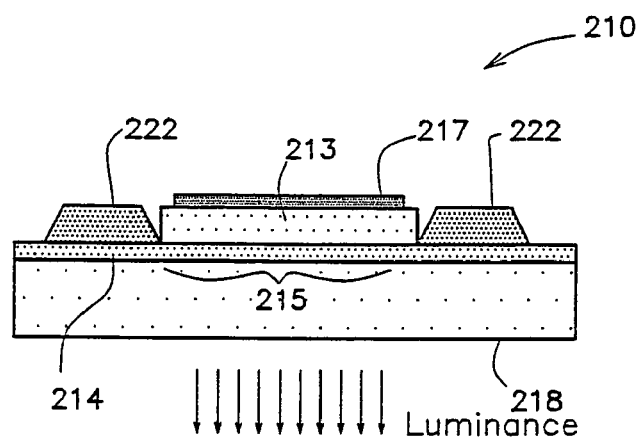
FIG. 10(a) is a cross sectional view of a bottom-emitting active matrix OLED display.
Figure 10B:
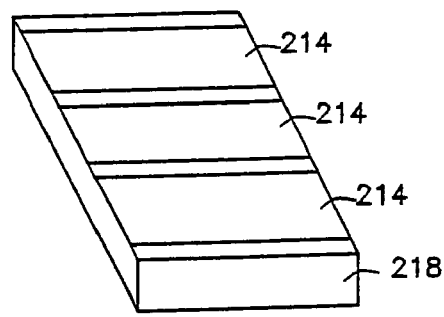
FIG. 10(b) is a perspective view of an OLED display with first display electrode lines.
Figure 10C:
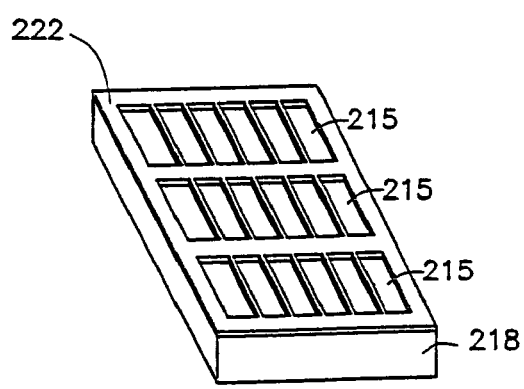
FIG. 10(c) is a perspective view of an OLED display wherein ribs are arranged.
Figure 10D:
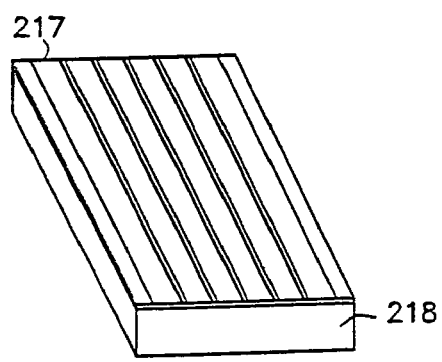
FIG. 10(d) is a perspective view of an OLED display in which second display electrode lines are formed.

Furthermore, the anode 14 and the thin film cathode 17 may be interchangeable in the above-mentioned embodiments of the present invention. More specifically, similar effects of removing luminance nonuniformity can be obtained in OLED displays wherein OLED elements 12 are created by forming a cathode on the insulating substrate 18 and laminating the material layer 13 and an anode. In this case, partitioning among the OLED elements by the ribs 22 makes it possible to remove luminance nonuniformity which occurs on OLED displays that have a structure in which the common electrodes are connected to the anode as shown in FIG. 4(*b*).

In each embodiment of the present invention described thus far, an insulating substrate 18 is made of glass or the like, but such substrate is not limited to a transparent material in so far as the top-emitting system is used for the OLED display. More particularly, the insulating substrate 18 is not particularly limited at all so long as it is an insulator; therefore, it may be made of plastic and the like.

Similarly, the anode is not limited to a transparent material but may be made from a metal, such as Al and a thin plate made of stainless steel or the like. Further, the abovementioned first opening window is not limited to be designated as virtual holes, through holes or the like and includes all opening windows for electrically connecting the cathode surface of the OLED elements and common electrodes.

The ribs 22 preferably include a reverse tapered shape crossing upwardly on a second electrode layer and may be so-called "cathode ribs". In this case, the ribs 22 also act in the role of a shadow mask at the time of laminating the cathode. Alternatively, the ribs 22 may be exclusively used for shutting down the continuity among the cell areas 32. In this case, the ribs 22 are not limited to a particular shape and material or the like as long as isolation among the cell areas 32 can be obtained.

Additionally, the cell areas 32 surrounded by the ribs 22 are in a rectangular shape partitioned in a row direction and a column direction, but the shape of the cell areas 32 is not particularly limited. The shape may be in some other polygonal shape, such as a triangular shape or the like.

Alternatively, the shape of the cell area 32 may be a round shape or an oval shape. The shape and size of each of the cell areas 32 may be arbitrary.

The cell areas 32 with such a shape are disposed in rows and columns to form a matrix. Alternatively, these cell areas 32 are aligned in such a manner as to form a polygonal grating, such as a triangular grating or a hexagonal grating. These cell areas 32 may also be arbitrarily disposed.

There have thus been shown and described a novel OLED display and a method of manufacturing such a display which fulfill all the objects and advantages sought therefor. Many changes, modifications, variations, combinations, and other uses and applications of the subject invention will, however, become apparent to those skilled in the art after considering this specification and accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. An organic light emitting diode display comprising: an insulating substrate;
    common electrodes formed on the insulating substrate;
    a first electrode layer formed in a region adjacent to the common electrodes formed on the insulating substrate electrically isolated from the common electrodes;
    an insulating layer which coats en the insulating substrate by and respectively opens a first opening window exposing a part of the common electrodes and a second opening window exposing at least a part of the first electrode layer;
    walls which form individual cell areas and which cross the common electrodes on the insulating substrate and surround each of the opening windows;
    a material layer formed on the first electrode layer exposed by the second opening window, the material layer having at least one organic light emitting layer; and
    a second electrode layer which coats the cell areas surrounded by the walls and is electrically connected to the common electrodes through the first opening window, wherein said walls electrically isolate said second electrode layer which coats each cell area.

2. The display according to claim 1, wherein said walls include a reverse tapered shape.

3. The display according to claim 1, wherein said cell area is in a shape selected from the group consisting of a polygonal shape, a round shape, and an oval shape partitioned by said walls.

4. The display according to claim 1, wherein an opening window is a virtual hole to reach from the surface of said second electrode layer to said common electrodes.

5. A method for manufacturing an organic light emitting diode display comprising:
    preparing an insulating substrate;
    forming common electrodes on the insulating substrate;
    forming a first electrode layer in a region adjacent to the common electrodes formed on the insulating substrate electrically isolated from the common electrodes;
    coating the insulating substrate with an insulating layer by respectively opening a first opening window exposing a part of the common electrodes and a second opening window exposing at least a part of the first electrode layer;
    forming a cell area on the insulating substrate by surrounding each of the opening windows with walls across the common electrodes;
    forming a material layer formed on the first electrode layer exposed by the second opening window the material layer having at least one organic light emitting layer; and
    applying a coating within the cell area to form a second electrode layer electrically connected to the common electrodes through the first opening window and electrically isolated from each adjacent cell area by said walls.

6. The method according to claim 5, wherein said cell area is formed by partitioning with walls in a shape selected from the group consisting of a polygonal shape, a round shape and an oval shape.

7. A method for manufacturing an organic light emitting diode display comprising:
    preparing an insulating substrate;
    forming band-like common electrodes on the insulating substrate;
    forming a first electrode layer in a region adjacent to the common electrodes formed on the insulating substrate;
    coating the insulating substrate with an insulating layer;
    forming walls in a reverse tapered shape and a thin insulating layer within a cell area surrounded by the walls by etching the insulating layer across the common electrodes;
    forming a first opening window exposing a part of the common electrodes and a second opening window exposing a part of the first electrode layer in the insulating layer within the cell area;

forming a material layer formed on the first electrode layer exposed by the second opening window the material layer having at least one organic light emitting layer; and forming a second electrode layer which coats the material layer and is electrically connected to the common electrodes through the first opening window by applying a coating with the second electrode layer using the walls as a mask within the cell area.

8. An organic light emitting diode display comprising:

an insulating substrate;

a wall separating a principal surface region of the insulating substrate into a plurality of cells, each cell being substantially enclosed by the wall;

a common electrode interposed between the insulating substrate and the wall, extending across more than two of the cells; wherein each of the cells includes;

a first electrode layer disposed on the insulating substrate to form an interval between the first electrode layer and the common electrode;

an insulating layer disposed on the insulating substrate and the common electrode, having a first opening window and a second opening window, the first opening window exposing a part of the common electrode, the second opening window exposing at least a part of the first electrode layer;

a material layer disposed on the first electrode layer exposed by the second opening window of the insulating layer, the material layer having at least one organic light emitting layer; and a second electrode layer disposed on the material layer and the insulating layer, electrically connecting to the common electrode through the first opening window of the insulating layer.

9. The display according to claim 8, wherein the wall has a reverse tapered shape in cross section.

10. The display according to claim 8, wherein a planar shape of the cell is selected from the group consisting of polygonal, round and oval.

11. A method for manufacturing an organic light emitting diode display comprising:

preparing an insulating substrate;

forming a common electrode on the insulating substrate;

forming a plurality of first electrode layers on the insulating substrate with an interval between the common electrode and each of the first electrode layers;

forming an insulating layer on the insulating substrate and the common electrode, the insulating layer having a first opening window and a second opening window, the first opening window exposing a part of the common electrode, the second opening window exposing at least a part of the first electrode layer;

forming a wall on the insulating layer, separating a principal surface region of the insulating substrate into a plurality of cells, each of the cells being substantially enclosed by the wall and having the first electrode layer, the common electrode, the first opening window and the second opening window therein;

forming a material layer on the first electrode layer exposed by the second opening window in each cell, having an organic light emitting layer; and forming a second electrode layer on the material layer and the insulating layer in each cell, electrically connecting to the common electrode through the first opening window of the insulating layer.

12. The method according to claim 11, wherein the wall has a reverse tapered shape in cross section.

13. The method according to claim 11, wherein a planar shape of the cells is selected from the group consisting of polygonal, round and oval.

14. A method for manufacturing an organic light emitting diode display comprising:

preparing an insulating substrate;

forming a common electrode on the insulating substrate;

forming a plurality of first electrode layers arranged on the insulating substrate with an interval between the common electrode and each of the first electrode layers;

forming an insulating layer on the insulating substrate, the common electrode and the first electrode layers;

etching the insulating layer to form a wall separating a principal surface region of the insulating substrate into a plurality of cells with the insulating layer inside the cells remaining, each cell being substantially enclosed by the wall;

etching the insulating layer remaining inside the cells to form a first opening window and a second opening window, the first opening window exposing a part of the common electrode, the second opening window exposing at least a part of the first electrode layer;

forming a material layer on the first electrode layer exposed by the second opening window in each cell, having at least an organic light emitting layer; and forming a second electrode layer on the material layer and the insulating layer in each cell, electrically connecting to the common electrode through the first opening window of the insulating layer.

15. The method according to claim 14, wherein the wall has a reverse tapered shape in cross section.

16. The method according to claim 14, wherein a planar shape of the cells is selected from the group consisting of polygonal, round and oval.

* * * * *